United States Patent
Lien

(10) Patent No.: US 11,501,977 B1
(45) Date of Patent: Nov. 15, 2022

(54) SEMICONDUCTOR DEVICE AND MANUFACTURING METHOD THEREOF

(71) Applicant: NANYA TECHNOLOGY CORPORATION, New Taipei (TW)

(72) Inventor: Chen-Hao Lien, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/316,697

(22) Filed: May 10, 2021

(51) Int. Cl.
　　*B32B 15/04*　　(2006.01)
　　*B32B 33/00*　　(2006.01)
　　*H01L 21/311*　　(2006.01)
　　*H01L 21/308*　　(2006.01)

(52) U.S. Cl.
　　CPC ...... *H01L 21/31144* (2013.01); *B32B 15/043* (2013.01); *B32B 33/00* (2013.01); *H01L 21/3081* (2013.01); *H01L 21/3086* (2013.01)

(58) Field of Classification Search
　　CPC ........... H01L 21/3146; H01L 21/32139; H01L 21/0332; H01L 21/02115
　　See application file for complete search history.

(56) References Cited

U.S. PATENT DOCUMENTS

| | | | |
|---|---|---|---|
| 9,412,613 | B2 | 8/2016 | Manna et al. |
| 2005/0112506 | A1* | 5/2005 | Czech ................ H01L 21/3081 430/323 |
| 2006/0024945 | A1* | 2/2006 | Kim .................... H01L 21/0332 257/E21.27 |

FOREIGN PATENT DOCUMENTS

KR　　20070074955 A　*　7/2007　....... H01L 21/02271

OTHER PUBLICATIONS

P.W. Leech et al., "Enhancement of the etch rate of CVD diamond by prior C and Ge implantation," Diamond and Related Materials, vol. 11, Issues 3-6, 2002, pp. 837-840.

* cited by examiner

*Primary Examiner* — Alicia J Sawdon
(74) *Attorney, Agent, or Firm* — CKC & Partners Co., LLC

(57) ABSTRACT

A semiconductor device includes a substrate, a conductive layer, a nitride mask layer, a carbon mask layer and an anti-reflective coating stack. The conductive layer is disposed on the substrate. The nitride mask layer is disposed on the conductive layer, wherein the nitride mask layer has a first stress. The carbon mask layer is disposed on the nitride mask layer, wherein the carbon mask layer has a second stress and a difference between the second stress and the first stress is smaller than 200 MPa. The anti-reflective coating stack is disposed on the carbon mask layer.

8 Claims, 17 Drawing Sheets

SEMICONDUCTOR DEVICE AND MANUFACTURING METHOD THEREOF

BACKGROUND

Field of Disclosure

The present disclosure relates to a semiconductor device and a manufacturing method thereof. More particularly, the present disclosure relates to a hard mask and a manufacturing method thereof.

Description of Related Art

As the semiconductor technology has progressed into nanoscale technology, the sizes of the semiconductor devices and the components therein are gradually reduced. In addition, thinner bitlines are desired to connect transistors in the scaled-down semiconductor device. Bitlines are usually produced by etching metal layers to form multiple stripes, and the properties of the hard mask used in the etching process will affect the patterns used for forming bitlines.

SUMMARY

In accordance with some embodiments of the present disclosure, a semiconductor device includes a substrate, a conductive layer, a nitride mask layer, a carbon mask layer and an anti-reflective coating stack. The conductive layer is disposed on the substrate. The nitride mask layer is disposed on the conductive layer, wherein the nitride mask layer has a first stress. The carbon mask layer is disposed on the nitride mask layer, wherein the carbon mask layer has a second stress and a difference between the second stress and the first stress is smaller than 200 MPa. The anti-reflective coating stack is disposed on the carbon mask layer.

In accordance with some embodiments of the present disclosure, the anti-reflective coating stack has a third stress and a difference between the third stress and the second stress is smaller than 300 MPa.

In accordance with some embodiments of the present disclosure, the carbon mask layer includes amorphous carbon.

In accordance with some embodiments of the present disclosure, the carbon mask layer has a first carbon concentration at a top surface of the carbon mask layer and a second carbon concentration at a bottom surface of the carbon mask layer, and the first carbon concentration is greater than the second carbon concentration.

In accordance with some embodiments of the present disclosure, the carbon mask layer has a carbon concentration distribution increasing from the first carbon concentration to a third concentration and then decreasing to the second carbon concentration in a direction from the top surface of the carbon mask layer to the bottom surface of the carbon mask layer.

In accordance with some embodiments of the present disclosure, the carbon mask layer has a thickness in a range of 200 nm to 250 nm.

In accordance with some embodiments of the present disclosure, the conductive layer includes tungsten.

In accordance with some embodiments of the present disclosure, the anti-reflective coating stack includes a first layer made of $Si_3N_4$, SiON, or combinations thereof and a second layer made of substantially pure silicon over the first layer.

In accordance with some embodiments of the present disclosure, the semiconductor device further includes a resist disposed on the anti-reflective coating stack.

In accordance with some embodiments of the present disclosure, a method of manufacturing a semiconductor device includes forming a conductive layer on a substrate, forming a nitride mask layer on the conductive layer, forming an amorphous carbon mask layer on the nitride mask layer, performing an implantation process to implant carbon into the amorphous carbon mask layer, forming a dielectric anti-reflective coating layer on the amorphous carbon mask layer, forming a patterned resist on the dielectric anti-reflective coating layer, and etching the dielectric anti-reflective coating layer, the amorphous carbon mask layer, the nitride mask layer and the conductive layer by using the patterned resist as an etch mask to form trenches therein.

In accordance with some embodiments of the present disclosure, the implantation process is performed at a tilt angle with respect to a normal direction of the amorphous carbon mask layer.

In accordance with some embodiments of the present disclosure, the tilt angle is greater than 0° and equal to or less than 50°.

In accordance with some embodiments of the present disclosure, the method further includes determining the tilt angle of the implantation process according to a thickness of the amorphous carbon mask layer.

In accordance with some embodiments of the present disclosure, the method further includes determining an implantation dose of the implantation process according to a thickness of the amorphous carbon mask layer.

In accordance with some embodiments of the present disclosure, the method further includes determining energy of the implantation process according to a thickness of the amorphous carbon mask layer.

In accordance with some embodiments of the present disclosure, the method further includes annealing the amorphous carbon layer after the implantation process and before forming the dielectric anti-reflective coating layer on the amorphous carbon mask layer.

In accordance with some embodiments of the present disclosure, the method further includes annealing the amorphous carbon mask layer after forming the dielectric anti-reflective coating layer on the amorphous carbon mask layer and before forming the patterned resist on the dielectric anti-reflective coating layer.

In accordance with some embodiments of the present disclosure, annealing the amorphous carbon mask layer is performed at the temperature in a range of 900° C. to 1000° C.

In accordance with some embodiments of the present disclosure, the nitride mask layer has a first stress, the implanted carbon mask layer has a second stress, and a difference between the second stress and the first stress is smaller than 200 MPa.

In accordance with some embodiments of the present disclosure, forming the dielectric anti-reflective coating layer includes forming a first layer made of $Si_3N_4$, SiON or combinations thereof on the amorphous carbon mask layer and forming a second layer made of silicon on the first layer.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
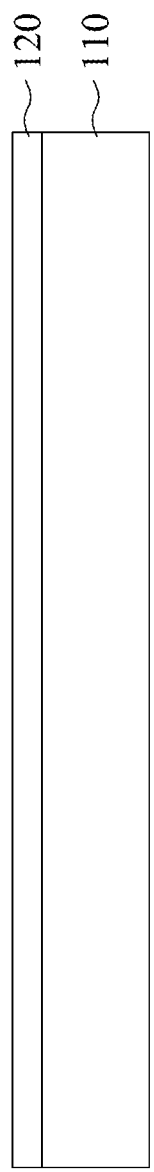
FIGS. 1-4B illustrate cross-sectional views of intermediate stages in the formation of a semiconductor device in accordance with some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

The present disclosure is related to the formation of a hard mask used to define bitlines in semiconductor devices. In the present disclosure, an amorphous carbon layer implanted with carbon is used to reduce the bitlines bending issue, which can result in straight bitlines and improve the performance of the semiconductor device. The embodiments described below may be used for dynamic random access memory (DRAM), static random access memory (SRAM), flash memory or the like.

Referring to FIG. 1, a substrate 110 is provided. In some embodiments, the substrate 110 may be made of silicon. In some embodiments, the substrate 110 may include a plurality of transistors formed therein, such as bipolar junction transistors (BJT), complementary metal-oxide-semiconductor (CMOS) transistors, field effect transistors (FET), metal-oxide-semiconductor field effect transistors (MOSFET), combinations thereof or the like. The substrate 110 may also include other active or passive components, such as diodes, capacitors, inductors, resistors, combinations thereof or the like.

Next, a conductive layer 120 is formed on the substrate 110. The conductive layer 120 will be etched to form bitlines to connect the transistors in the substrate 110 in the subsequent process. In some embodiments, the conductive layer 120 is formed by chemical vapor deposition (CVD), physical vapor deposition (PVD), atom layer deposition (ALD) or the like. In some embodiments, the conductive layer 120 includes metal and may be tungsten, aluminum, copper, combinations thereof, or the like. In some embodiments, the conductive layer 120 has the thickness in a range of about 25 nm to about 45 nm.

Figure 2:
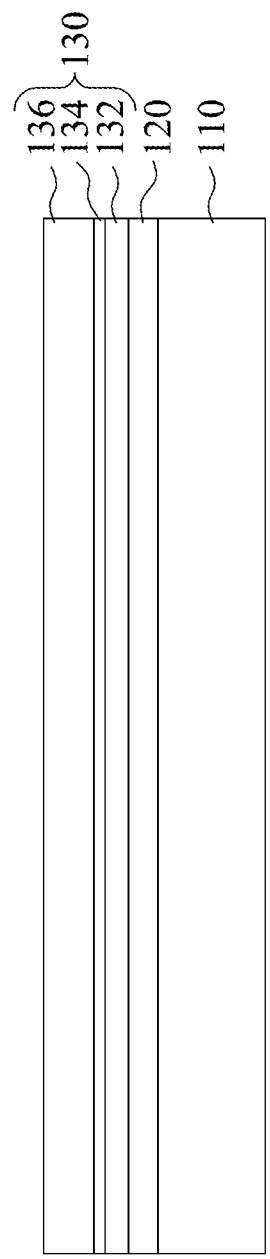

Referring to FIG. 2, a nitride mask layer 130 is formed on the conductive layer 120. In some embodiments, the nitride mask layer 130 is formed by chemical vapor deposition (CVD), physical vapor deposition (PVD), atom layer deposition (ALD) or the like. In some embodiments, the nitride mask layer 130 has the thickness in a range of about 135 nm to about 165 nm.

In some embodiments, the nitride mask layer 130 includes multiple sub-layers. For example, the nitride mask layer 130 includes a first sub-layer 132, a second sub-layer 134 over the first sub-layer 132, and a third sub-layer 136 over the second sub-layer 134. The first sub-layer 132 may be a silicon nitride layer, the second sub-layer 134 may be an oxinitride layer, and the third sub-layer 136 may be a silicon nitride layer. In some embodiments, the first sub-layer 132 has a thickness in a range of about 40 nm to about 60 nm, the second sub-layer 134 has a thickness in a range of about 5 nm to about 10 nm, and the third sub-layer 136 has a thickness in a range of about 90 nm to about 120 nm. In some embodiments, the thickness of the third sub-layer 136 is greater than the thickness of the first sub-layer 132, and/or the thickness of the first sub-layer 132 is greater than the thickness of the second sub-layer 134.

Figure 3:
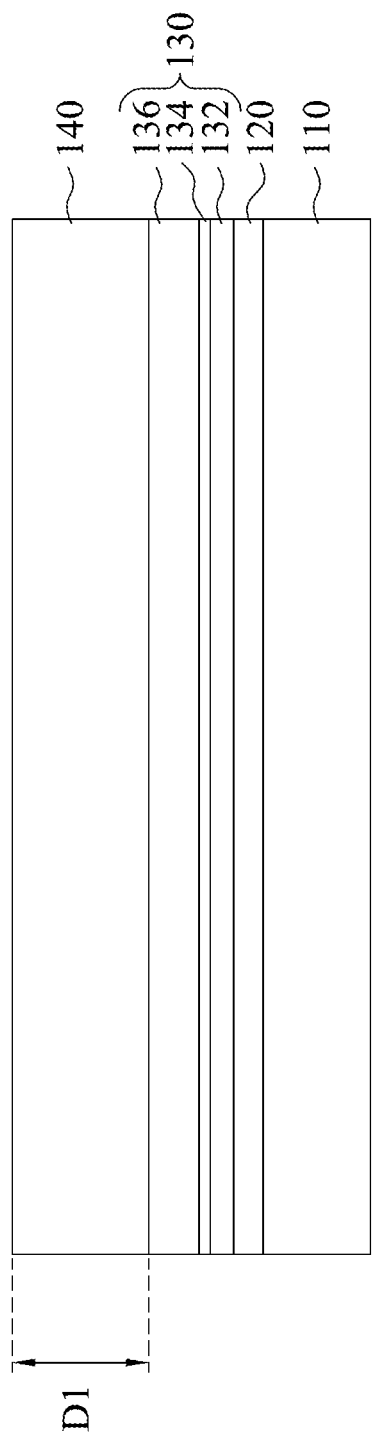

Referring to FIG. 3, a carbon mask layer 140 is formed on the nitride mask layer 130. Different carbon materials with different properties, such as the etching selectivity to the oxide, or the stress during the process, may be chosen according to the condition (such as temperature and pressure) of the process. In some embodiments, the carbon mask layer 140 may be a pure carbon layer that is free from other chemical elements. The carbon mask layer 140 may also be a substantially pure carbon layer, for example, with a carbon atomic percentage higher than 99 percent. That is, a carbon concentration of the carbon mask layer 140 is higher than carbon concentrations of the first sub-layer 132, the second sub-layer 134, and the third sub-layer 136 of the nitride mask layer 130. In some embodiments, the carbon mask layer 140 is made of amorphous carbon and the stress of the carbon mask layer 140 is about 70 MPa to about 100 MPa. The carbon mask layer 140 made with amorphous carbon takes advantage of lower stress than other carbon materials. Therefore, while etching the carbon mask layer 140 made with amorphous carbon to form trenches therein, the trenches will be straight and the bending issue of the bitlines may be reduced. In some embodiments, the carbon mask layer 140 has a thickness D1 in a range of about 200 nm to about 250 nm. In some embodiments, the thickness D1 of the carbon mask layer 140 is greater than the thickness of the nitride mask layer 130.

Figure 4A:
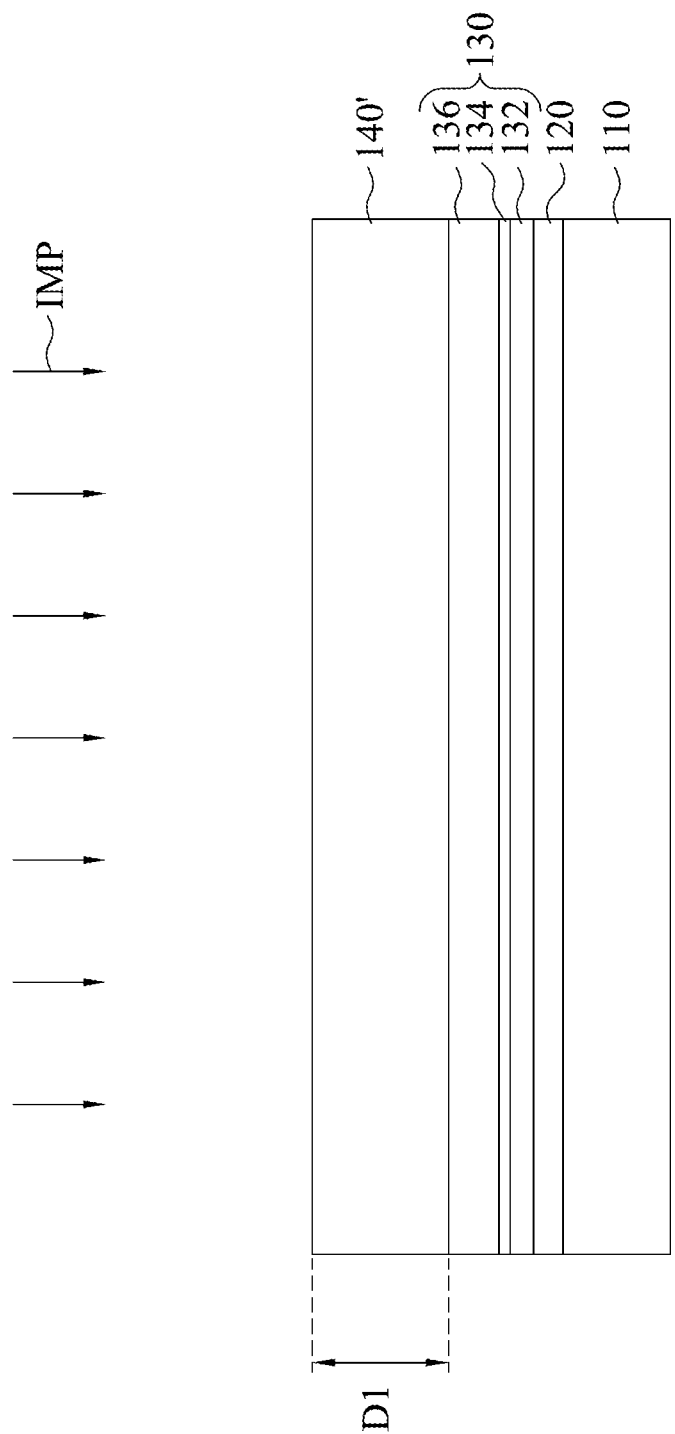

Referring to FIG. 4A, after forming the carbon mask layer 140, an implantation process IMP is performed to form an implanted carbon mask layer 140'. In the implantation process IMP, carbon may be implanted into the carbon mask layer 140 to enhance the stress of the carbon mask layer 140, and also increase an etching selectivity to the oxide. In some embodiments, carbon implanted into the carbon mask layer 140 is carbon atom.

Figure 4B:
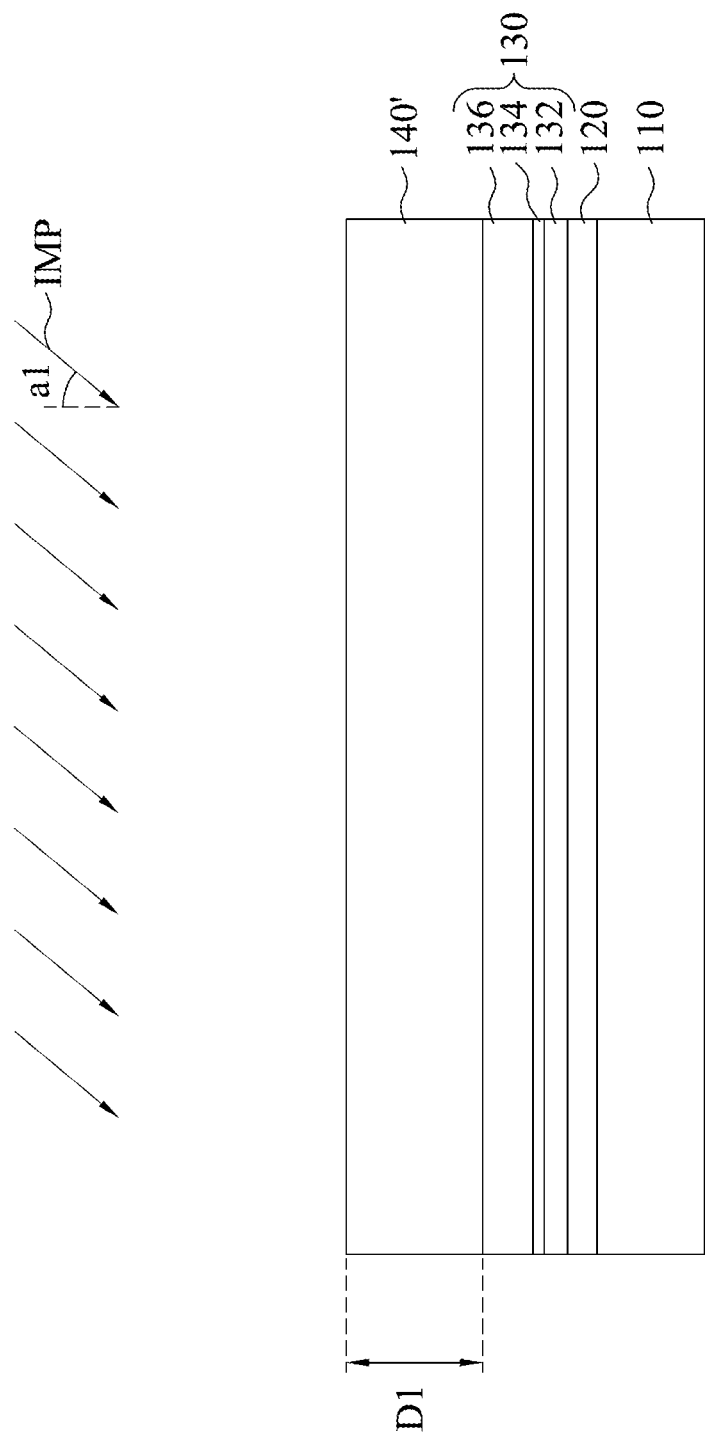

The implantation process IMP may be performed at different angles based on the thickness of the carbon mask layer 140. In some embodiments, the implantation process IMP is performed in a direction perpendicular to the top surface of the carbon mask layer 140, as shown in FIG. 4A. In some other embodiments, the implantation process IMP is performed at a tilt angle a1 with respect to the normal direction of the carbon mask layer 140, as shown in FIG. 4B. In some embodiments, the tilt angle a1 is greater than 0° and equal to or less than 50°. Implanting carbon at the tilt angle a1 may reduce channeling effects during the implantation process IMP. Therefore, a more evenly-distributed implanted carbon distribution may be achieved at the tilt angle a1. Also, the oblique implantation process IMP can increase doping concentration of carbon without damaging the underlying layer (such as the nitride mask layer 130) of the carbon mask layer 140 when the carbon mask layer 140 has a small thickness D1. If the implantation process IMP is performed above the disclosed range of the tilt angle, it may be more difficult to implant carbon atoms into the carbon mask layer 140, because the tilt angle becomes relatively parallel with regards to the top surface of the carbon mask layer 140.

Other parameters, such as implantation dose or implantation energy, of the implantation process IMP may be adjusted based on the thickness D1 of the carbon mask layer 140 and the tilt angle a1. For examples, a greater implantation dose may be used for the carbon mask layer 140 with a greater thickness, and a lower implantation dose may be used for the carbon mask layer 140 with a thinner thickness. In some embodiments, the implantation dose of the implantation process IMP is in a range of about $1\times10^{15}$ atoms/cm$^2$ to about $9\times10^{15}$ atoms/cm$^2$. If the implantation process IMP is performed below the disclosed range of the implantation dose, the amount of implanted carbon may be too low to improve properties, such as stress and etching selectivity to the oxide, of the implanted carbon mask layer 140'. If the implantation process IMP is performed above the disclosed range of the implantation dose, the amount of implanted carbon may exceed a saturation concentration, which may not provide a significant improvement of the implanted carbon mask layer 140'.

Further, a greater implantation energy may be used for the carbon mask layer 140 with a greater thickness, and a lower implantation energy may be used for the carbon mask layer 140 with a thinner thickness. In addition, because there is no channeling effect or the channeling effects are reduced, a greater implantation energy may be used for the carbon mask layer 140 at a greater tilt angle a1, and a lower implantation energy may be used for the carbon mask layer 140 at a smaller tilt angle a1. In some embodiments, the implantation energy is in a range of about 20 KeV to about 50 KeV. If the implantation process IMP is performed below the disclosed range of the implantation energy, the implanted carbon may barely reach to a bottom portion of the carbon mask layer 140. If the implantation process IMP is performed above the disclosed range of the implantation energy, the energy may be too strong, so that the implanted carbon may reach the underlying layer (such as the nitride mask layer 130), thereby damaging the underlying layer.

Figure 5B:
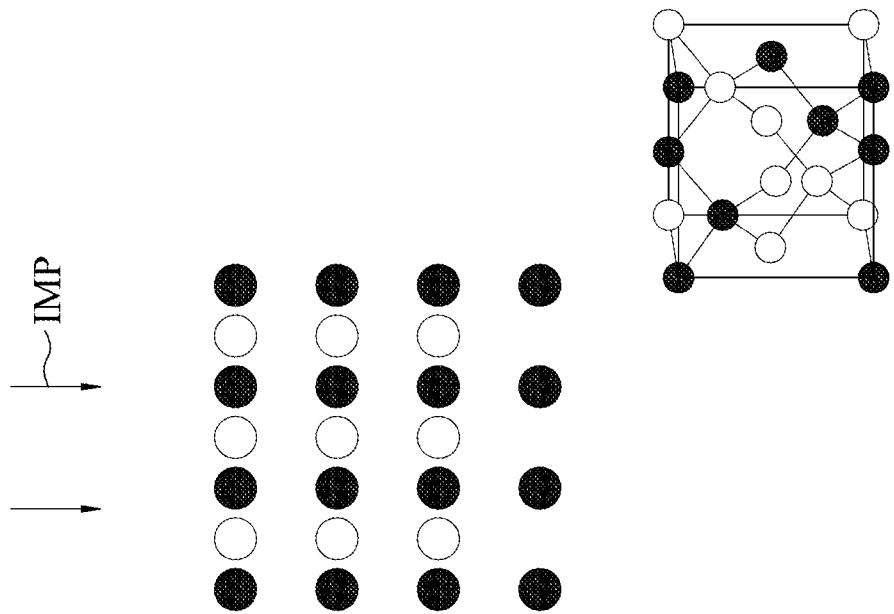
FIGS. 5A-5B illustrate a carbon implantation process during the formation of the semiconductor device in accordance with some embodiments of the present disclosure.
Figure 5A:
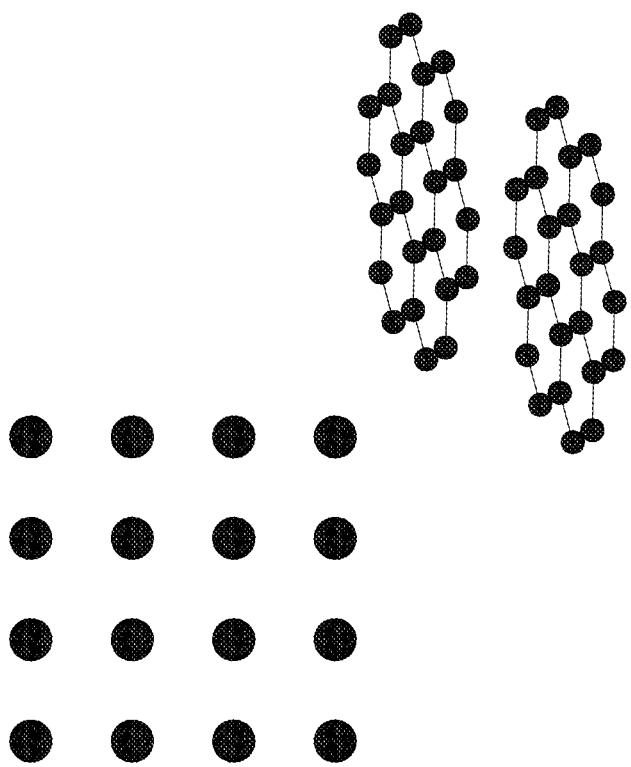

FIGS. 5A-5B illustrate the carbon implantation process IMP during the formation of the semiconductor device in accordance with some embodiments of the present disclosure. Prior to the implantation process IMP, amorphous carbon atoms in the carbon mask layer 140 tend to bond with each other with sp$^2$ orbitals, forming a planar structure in the carbon mask layer 140, as shown in FIG. 5A. Some voids are also formed between the adjacent carbon atoms. During the implantation process IMP, the implanted carbon atoms are introduced to the carbon mask layer 140 and fill the voids between the original carbon atoms, as shown in FIG. 5B. Therefore, the implanted carbon atoms bond to the original carbon atoms with sp$^3$ orbitals to form a 3-D structure, thereby improving the stress and the etching selectivity to oxide of the implanted carbon mask layer 140'. The stress of the implanted carbon mask layer 140' may increase after the implantation process IMP, so that a difference between the stress of the implanted carbon mask layer 140' and the nitride mask layer 130 may increase. In some embodiments, the difference between the stress of the implanted carbon mask layer 140' and the nitride mask layer 130 is smaller than about 200 MPa, while the difference between the stress of the carbon mask layer 140 and the nitride mask layer 130 is smaller than about 80 MPa.

Figure 6A:
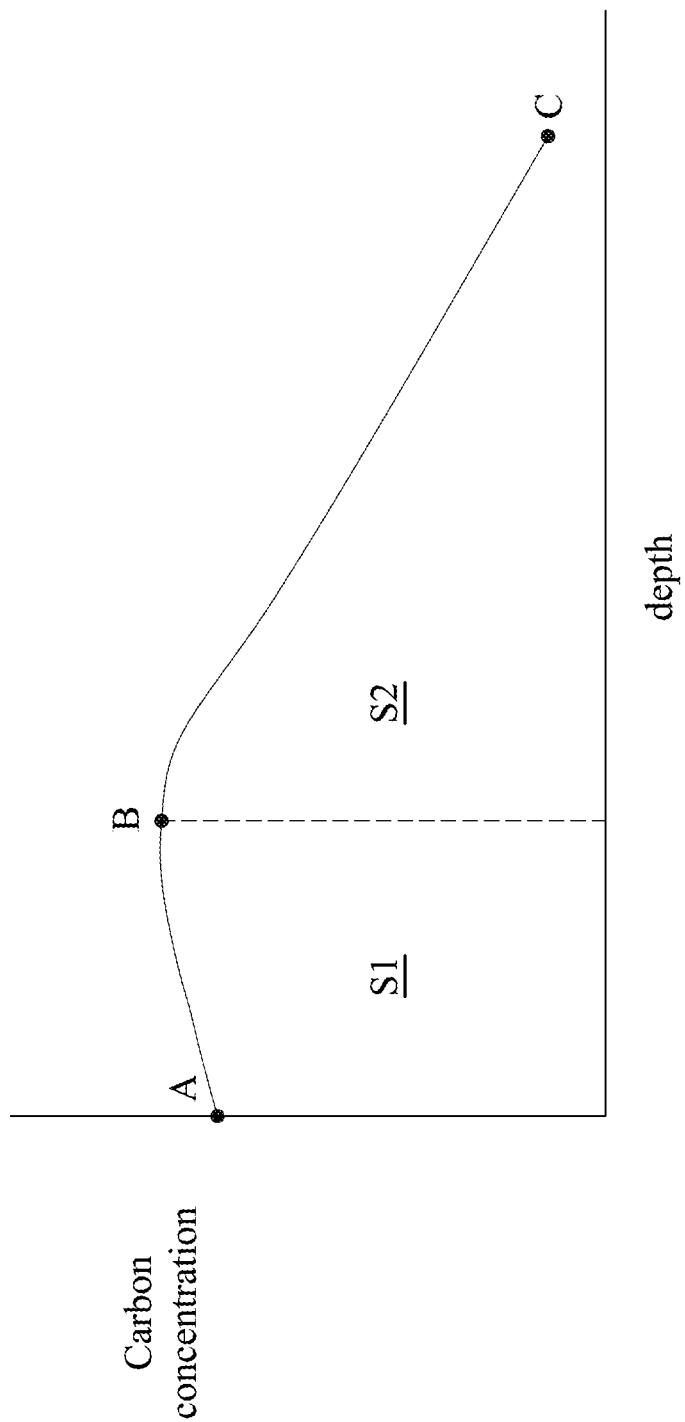
FIGS. 6A-6B illustrate implanted carbon concentration distributions in the implanted carbon mask layer in accordance with some embodiments of the present disclosure.
Figure 6B:
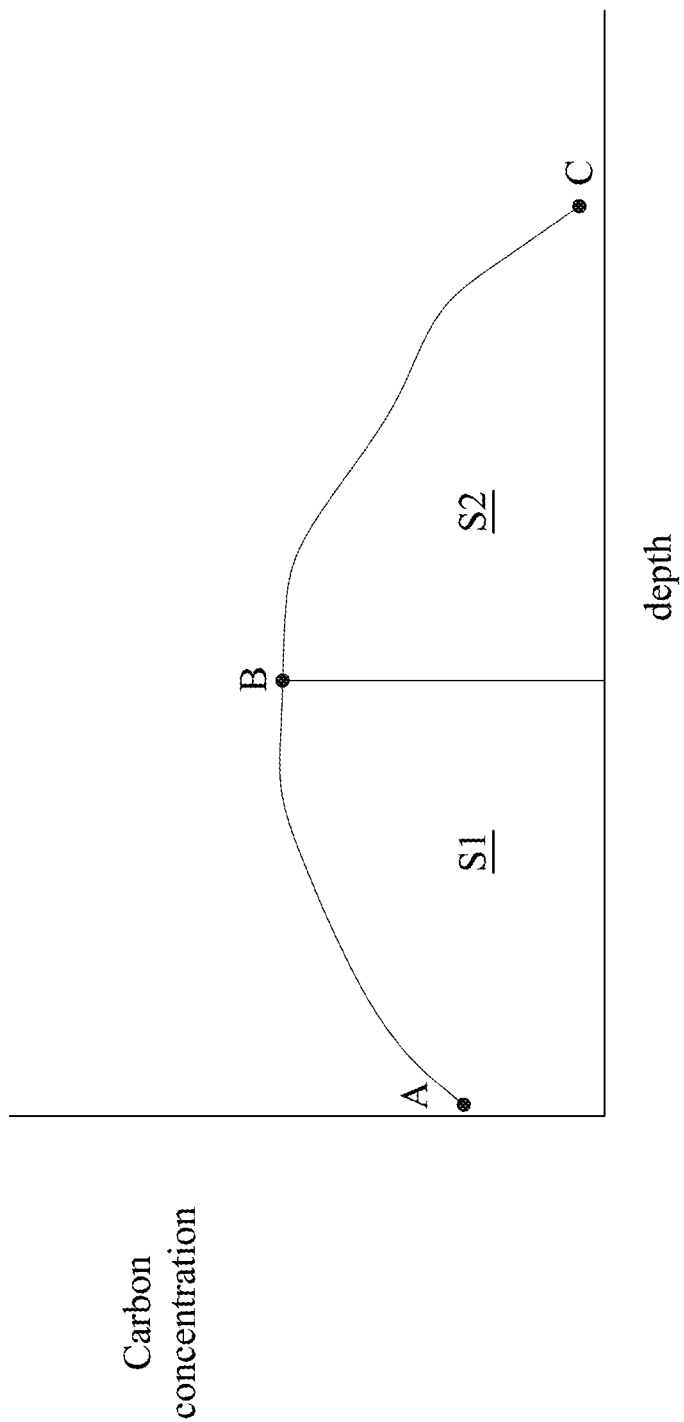

FIGS. 6A-6B illustrate implanted carbon concentration distributions in the implanted carbon mask layer 140' in accordance with some embodiments of the present disclosure. The implantation process is performed from the top of the carbon mask layer 140, and the implanted carbon enters from the top surface of the carbon mask layer 140 (i.e. where the depth is 0), moving down to the bottom portion of the carbon mask layer 140. The implanted carbon concentration increases in the section S1 as the depth of implanted carbon mask layer 140' increases. For examples, the concentration increases from a concentration A where the depth of implanted carbon mask layer 140' is 0 to a maximum concentration B. In some embodiments, the section S1 accounts for relatively low proportion of the implanted carbon mask layer 140', as shown in FIG. 6A. In some other embodiments, the section S1 accounts for higher proportion of the implanted carbon mask layer 140', as shown in FIG. 6B. Further, the implanted carbon concentration decreases in the section S2 as the depth of implanted carbon mask layer 140' increases. For examples, the concentration decreases from the concentration B to a concentration C at the bottom surface of the implanted carbon mask layer 140'. In some embodiments, the section S2 accounts for relatively high proportion of the implanted carbon mask layer 140', as shown in FIG. 6A. In some other embodiments, the section S2 accounts for lower proportion of the implanted carbon mask layer 140', as shown in FIG. 6B. Generally, the concentration A at the top surface of the implanted carbon mask layer 140' is higher than the concentration C at the bottom surface of the implanted carbon mask layer 140' due to the characteristic of the implantation process.

Figure 7:
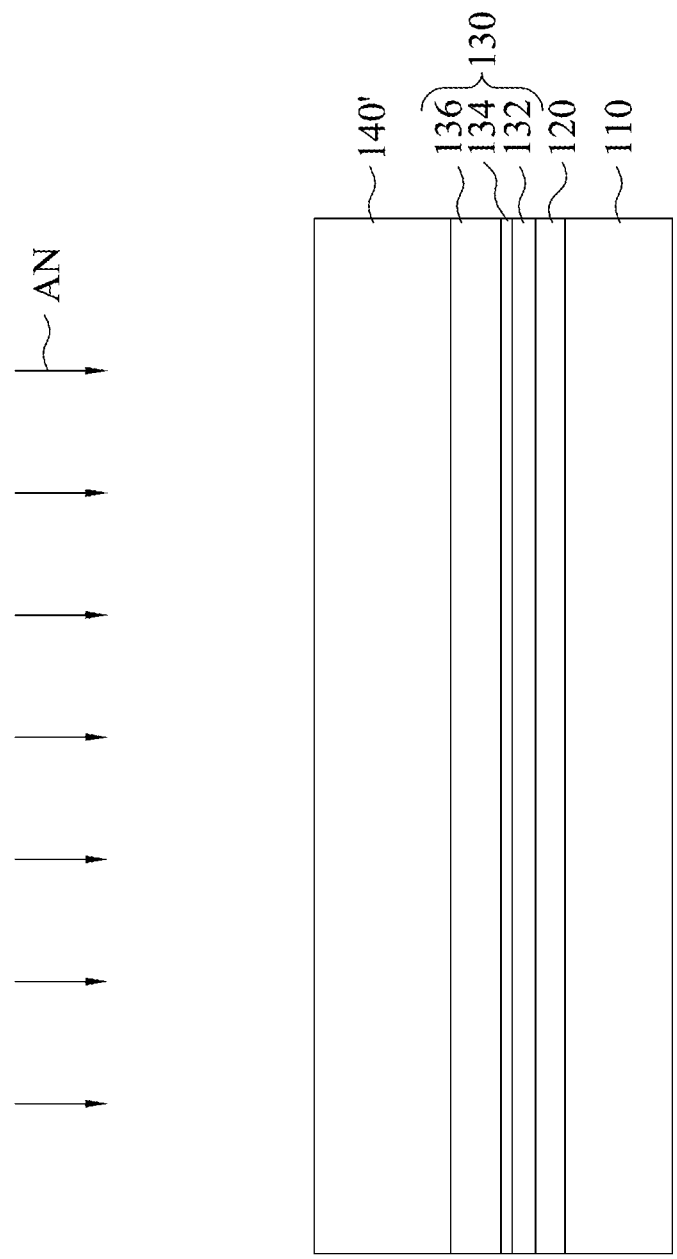
FIGS. 7-14 illustrate cross-sectional views of intermediate stages in the formation of a semiconductor device in accordance with some embodiments of the present disclosure.

Referring to FIG. 7, after performing the implantation process, an annealing process AN may be performed to make the implanted carbon mask layer 140' denser, and further enhance the structures of the implanted carbon mask layer 140'. The conditions (such as temperature, duration and the gas type) of annealing process AN may be chosen according to the situation. In some embodiments, the annealing process AN is performed under $N_2$ surroundings. In some embodiments, the duration of the annealing process AN is in range of about 15 seconds to about 25 seconds, such as about 20 seconds. In some embodiments, the temperature of the annealing process AN is in range of about 900° C. to about 1000° C., such as about 980° C. If the duration or the temperature of the annealing process AN is below the disclosed range, it may be insufficient to improve the properties of the implanted carbon mask layer 140'. If the duration or the temperature of the annealing process AN is above the disclosed range, it may cause damage to the implanted carbon mask layer 140'.

Figure 8:
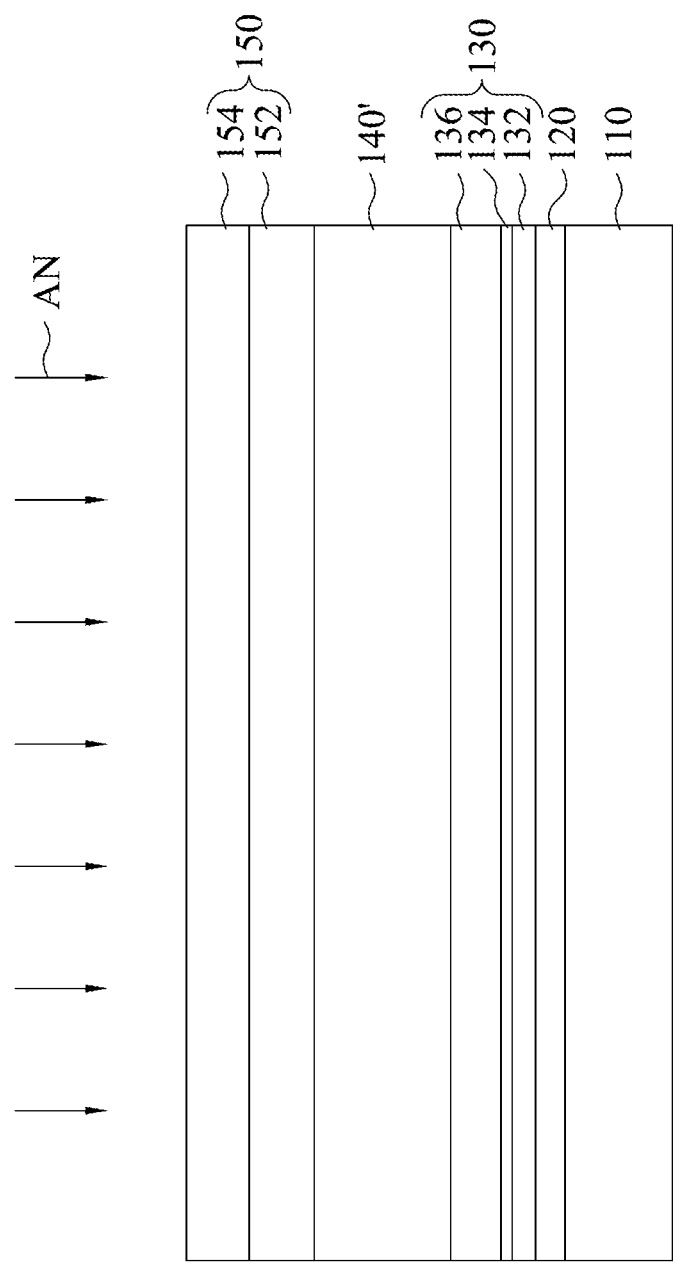

Referring to FIG. 8, an anti-reflective coating stack 150 is formed on the implanted carbon mask layer 140'. The anti-reflective coating stack 150 may be made of any suitable anti-reflective dielectric material. In some embodiments, the anti-reflective coating stack 150 includes two layers, such as a first layer 152 and a second layer 154. The first layer 152 is made of $Si_3N_4$, SiON, or combinations thereof and the second layer 154 is made of substantially pure silicon over the first layer 152. The anti-reflective coating stack 150 may be formed by CVD, PVD, ALD or the like. In some embodiments, the difference between the stress of the anti-reflective coating stack 150 and the implanted carbon mask layer 140' is smaller than about 300 MPa. It is noted that although FIG. 8 illustrates two layers in the anti-reflective coating stack 150, the number of the layers in the stack are not limited and may be 1 or 3 or more. In some embodiments, the anti-reflective coating stack 150 has a thickness in range of about 95 nm to about 105 nm. The first layer 152 has a thickness is in range of about 45 nm to about 50 nm. The second layer 154 has a thickness is in range of about 50 nm to about 55 nm.

In some embodiments, the annealing process AN is performed after the formation of the anti-reflective coating stack 150 instead of performed after the formation of the carbon mask layer 140. The annealing process AN performed after the formation of the anti-reflective coating stack 150 may also form a silicon nitride layer on the top surface of the anti-reflective coating stack 150 at the same time. Detailed description of the annealing process AN is similar or the same as details discussed in the FIG. 7; therefore, repeated description is not discussed here.

Figure 9:
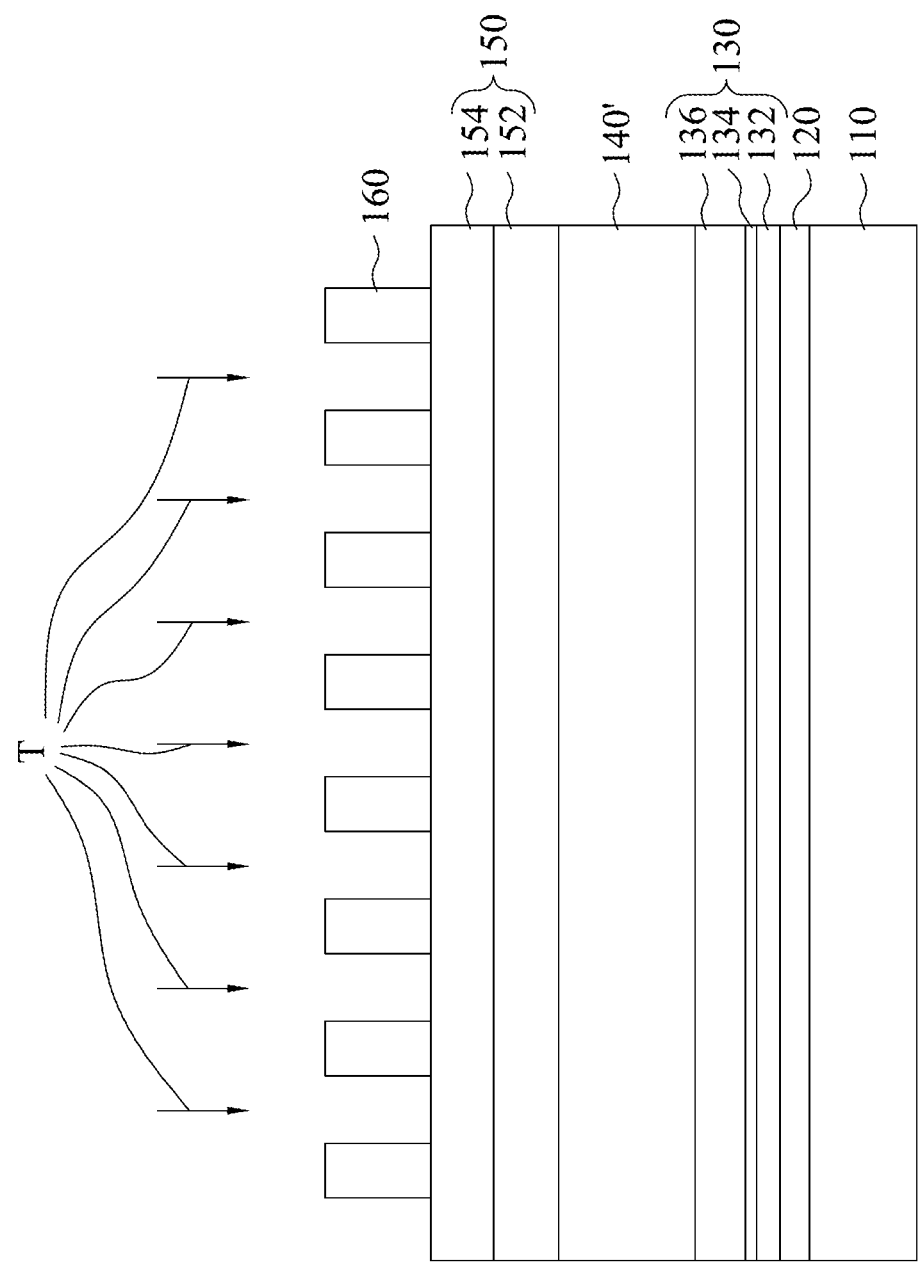
Figure 15:
FIG. 15 is a top view of the semiconductor device after the etching process in accordance with some embodiments of the present disclosure.

Referring to FIG. 9, a patterned resist 160 is formed on the anti-reflective coating stack 150. Discussed in greater detail, the patterned resist 160 may be formed in following sequences. A photoresist layer is formed on the anti-reflective coating stack 150 using suitable process (such as spin-on coating). Subsequently, a non-transparent pattern is formed on the photoresist layer, and an exposure source is used to expose the photoresist layer. After the exposure, the photoresist layer is developed to form a pattern therein and the pattern is same as the non-transparent pattern. Different patterns may be chosen for different usages. For examples, a pattern with multiple stripes (as shown in FIG. 15) may be used to forming the bitlines in the semiconductor device. After development, the patterned resist 160 with trenches T are formed.

Figure 10:
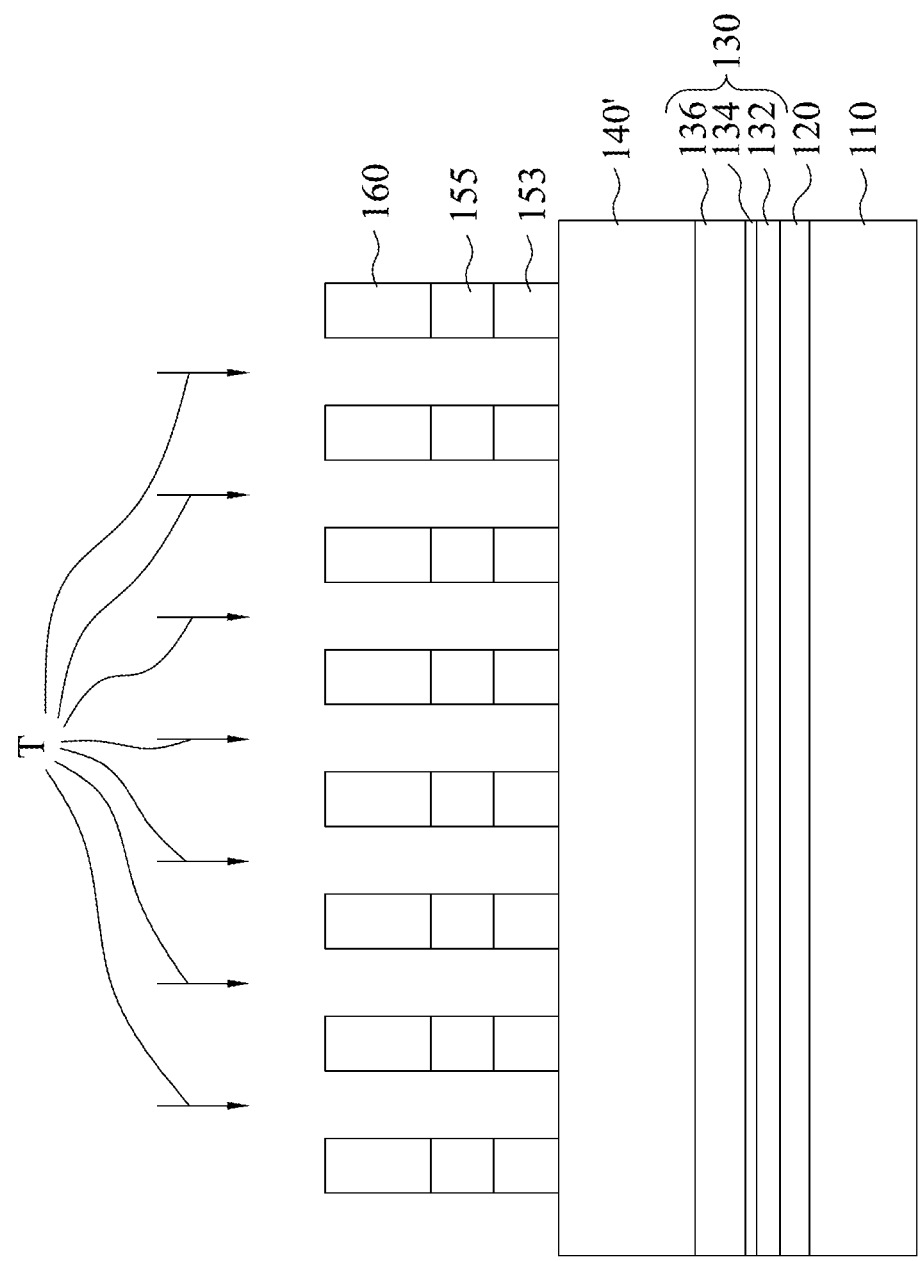

Referring to FIG. 10, the patterns of trenches T are transferred to the underlying anti-reflective coating stack 150. Discussed in greater detail, the patterned resist 160 is used as a mask, and the anti-reflective coating stack 150 is then etched by a suitable etching process such as dry etching, wet etching, or combinations thereof. As a result, the trenches T are extended into the anti-reflective coating stack 150 (see FIG. 9). In some embodiments, the patterns of the trenches T are first transferred to the second layer 154 to form a patterned second layer 155. Next, the patterned second layer 155 is used as a mask to pattern the first layer 152 and a patterned first layer 153 is formed.

Figure 11:
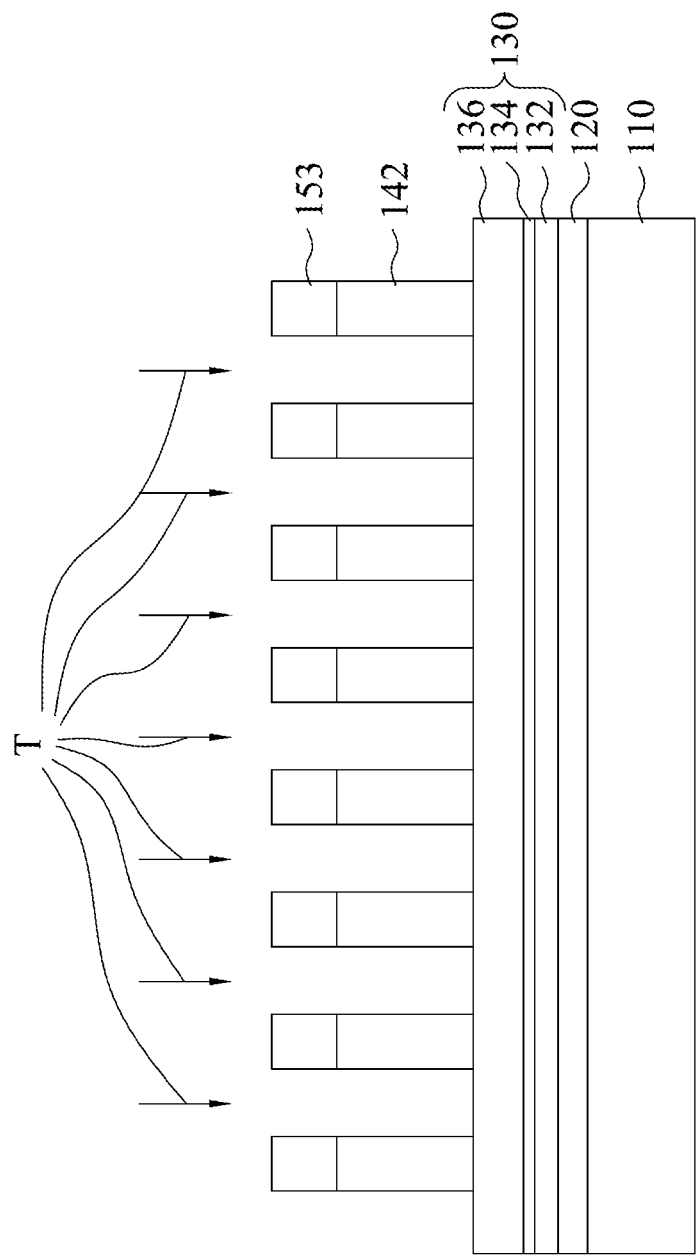

Referring to FIG. 11, the patterns of trenches T are transferred to the underlying implanted carbon mask layer 140' to form a patterned mask layer 142, which serves as the hard mask to subsequently form bitlines. Detailed description of this operation is similar or the same as details discussed in FIG. 10; therefore, repeated description is not discussed here. In some embodiments, during etching the implanted carbon mask layer 140', the etching process also etches the upper portion of the anti-reflective coating stack 150, such as the patterned second layer 155 (see FIG. 10).

Figure 12:
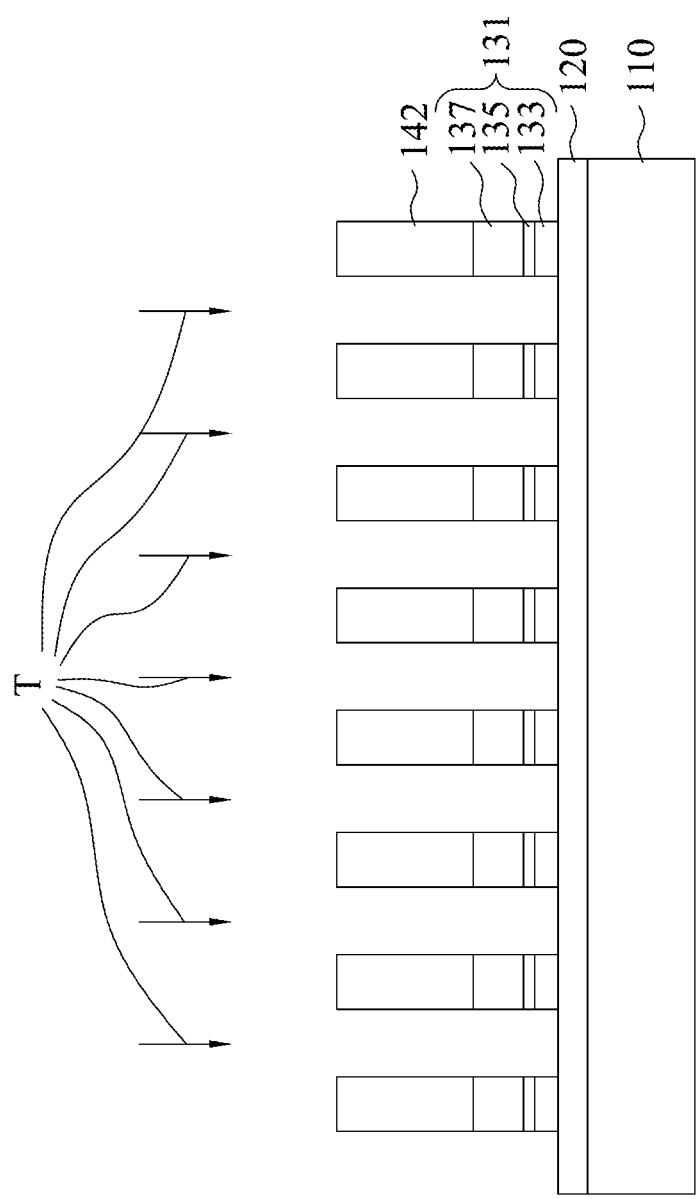

Referring to FIG. 12, the patterns of trenches T are transferred to the underlying nitride mask layer 130 to form a patterned nitride mask layer 131. In some embodiments, the patterned nitride mask layer 131 includes a patterned first sub-layer 133, a patterned second sub-layer 135 and a patterned third sub-layer 137. Detailed description of this operation is similar or the same as details discussed in FIG. 10; therefore, repeated description is not discussed here. In some embodiments, during etching the implanted carbon mask layer 140', the etching process also removes the remaining portion of the anti-reflective coating stack 150, such as the patterned first layer 153 (see FIG. 11).

Figure 13:
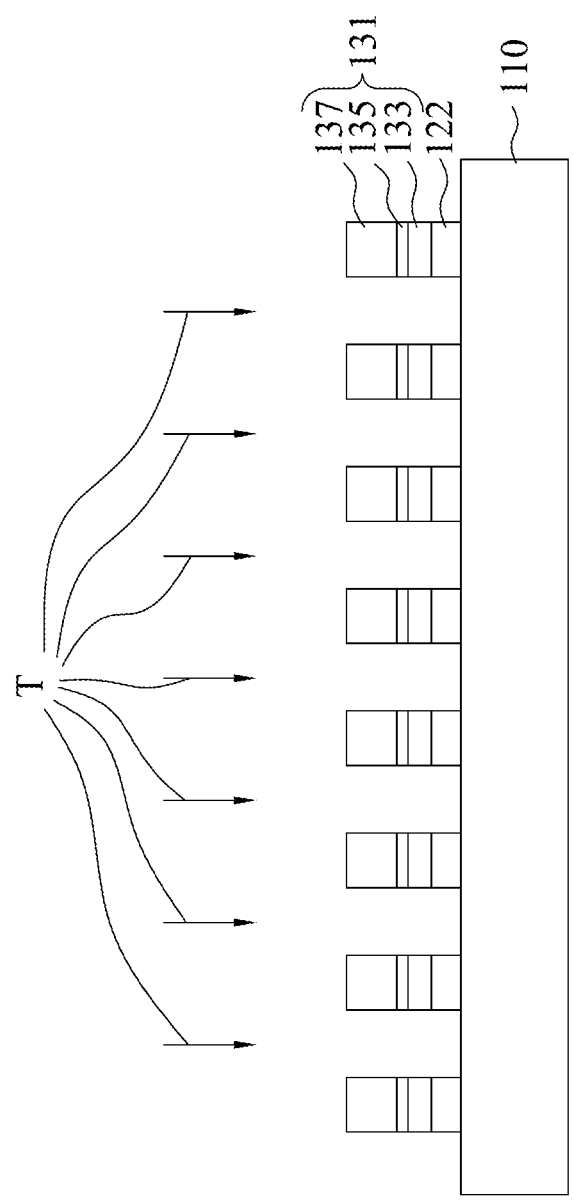
Figure 14:
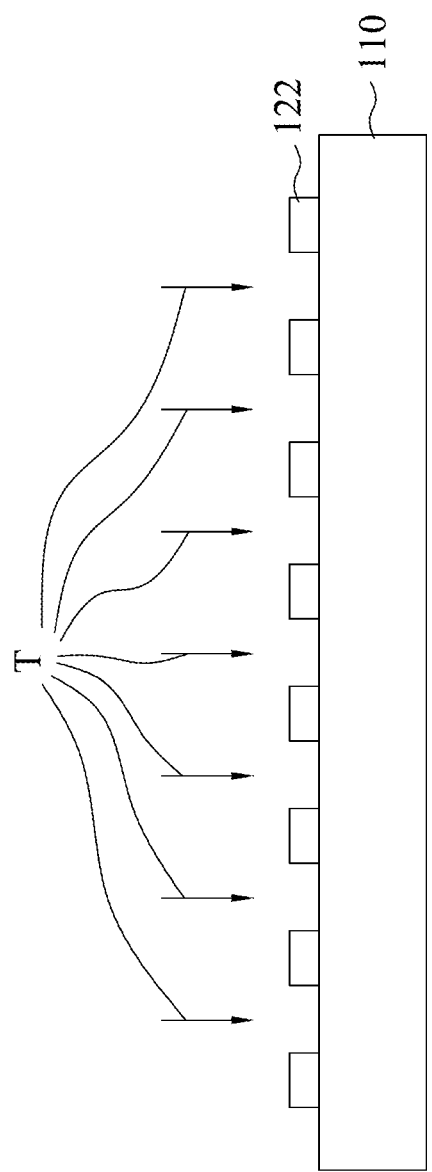

Referring to FIG. 13, the patterns of trenches T are transferred to the underlying conductive layer 120 to form bitlines 122. Detailed description of this operation is similar or the same as details discussed in FIG. 10; therefore, repeated description is not discussed here. After forming the trenches T in the conductive layer 120, the patterned mask layer 142 is removed. Finally, the patterned nitride mask layer 131 is also removed referring to FIG. 14.

FIG. 15 is a top view of the semiconductor device after the etching process in accordance with some embodiments of the present disclosure. As shown in FIG. 15, the bitlines 122 are formed in stripes with trenches T therebetween. In some embodiments, after forming the bitlines 122, additional processes may be performed to manufacture additional components. For example, one or more etching process is performed in the substrate 110 to extend the trenches T, and then a dielectric layer may be formed between the bitlines 122 to provide electrical isolation. Other suitable components, such as metal pads, may also be formed after formation of bitlines 122.

The present disclosure provides advantages. The bitlines formed by the hard mask in the present disclosure have straight boundaries. With this advantage, the bitlines bending issue is reduced, thereby improving the performance of the semiconductor device.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor device, comprising:
   a substrate;
   a conductive layer disposed on the substrate;
   a nitride mask layer disposed on the conductive layer, wherein the nitride mask layer has a first stress;
   a carbon mask layer disposed on the nitride mask layer, wherein the carbon mask layer has a second stress and a difference between the second stress and the first stress is smaller than 200 MPa, and carbon atoms in the carbon mask layer bond to each other with sp3 orbitals, and the carbon mask layer has a first carbon concentration at a top surface of the carbon mask layer and a second carbon concentration at a bottom surface of the carbon mask layer, and the first carbon concentration is greater than the second carbon concentration; and
   an anti-reflective coating stack disposed on the carbon mask layer.

2. The semiconductor device of claim 1, wherein the anti-reflective coating stack has a third stress and a difference between the third stress and the second stress is smaller than 300 MPa.

3. The semiconductor device of claim 1, wherein the carbon mask layer comprises amorphous carbon.

4. The semiconductor device of claim 1, wherein the carbon mask layer has a carbon concentration distribution increasing from the first carbon concentration to a third concentration and then decreasing to the second carbon concentration in a direction from the top surface of the carbon mask layer to the bottom surface of the carbon mask layer.

5. The semiconductor device of claim 1, wherein the carbon mask layer has a thickness in a range of 200 nm to 250 nm.

6. The semiconductor device of claim 1, wherein the conductive layer comprises tungsten.

7. The semiconductor device of claim 1, wherein the anti-reflective coating stack comprises a first layer made of $Si_3N_4$, SiON, or combinations thereof and a second layer made of substantially pure silicon over the first layer.

8. The semiconductor device of claim 1, further comprising a resist disposed on the anti-reflective coating stack.

* * * * *